United States Patent
Kim et al.

(10) Patent No.: US 9,088,001 B2
(45) Date of Patent: Jul. 21, 2015

(54) ORGANIC LIGHT EMITTING DISPLAY AND METHOD FOR FABRICATING THE SAME

(71) Applicant: LG DISPLAY CO., LTD., Seoul (KR)

(72) Inventors: Young-Ju Kim, Paju-Si (KR); Jeong-Kyun Shin, Paju-Si (KR); Hee-Jin Kim, Yongin-Si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/540,879

(22) Filed: Nov. 13, 2014

(65) Prior Publication Data

US 2015/0155515 A1  Jun. 4, 2015

(30) Foreign Application Priority Data

Dec. 2, 2013 (KR) .................. 10-2013-0148595

(51) Int. Cl.
*H01L 51/52* (2006.01)
*H01L 51/50* (2006.01)
*H01L 51/56* (2006.01)

(52) U.S. Cl.
CPC .......... *H01L 51/5008* (2013.01); *H01L 51/504* (2013.01); *H01L 51/5016* (2013.01); *H01L 51/56* (2013.01); *H01L 2251/5384* (2013.01)

(58) Field of Classification Search
CPC ... H01L 51/5008; H01L 51/504; H01L 51/56; H01L 51/5016; H01L 2251/5384
See application file for complete search history.

(56) References Cited

U.S. PATENT DOCUMENTS

| | | | | |
|---|---|---|---|---|
| 2008/0224607 | A1* | 9/2008 | Matsuo et al. | 313/505 |
| 2011/0180825 | A1* | 7/2011 | Lee et al. | 257/89 |
| 2014/0159023 | A1* | 6/2014 | Matsumoto et al. | 257/40 |
| 2014/0284565 | A1* | 9/2014 | Park et al. | 257/40 |
| 2014/0374707 | A1* | 12/2014 | Seo et al. | 257/40 |

* cited by examiner

*Primary Examiner* — Donald Raleigh
(74) *Attorney, Agent, or Firm* — Birch, Stewart, Kolasch & Birch, LLP

(57) ABSTRACT

Discussed are an organic light emitting display and a method for fabricating the same to improve color purity and efficiency. The organic light emitting display includes a substrate having first to third sub-pixels, first and second electrodes formed on the substrate, the first and second electrodes facing each other, a red light emitting layer formed in the first sub-pixel between the first and second electrodes, a green light emitting layer formed in the second sub-pixel between the first and second electrodes, and a blue common light emitting layer formed in the first to third sub-pixels between the first and second electrodes, wherein a thin film layer formed between the first electrode and the blue common light emitting layer and contacting the blue common light emitting layer includes a blue host.

20 Claims, 11 Drawing Sheets

ORGANIC LIGHT EMITTING DISPLAY AND METHOD FOR FABRICATING THE SAME

This application claims the priority benefit of Korean Patent Application No. 10-2013-0148595, filed on Dec. 2, 2013, which is hereby incorporated by reference as if fully set forth herein.

BACKGROUND OF THE INVENTION

1. Field of the Invention

The present invention relates to an organic light emitting display and a method for fabricating the same to improve color purity and efficiency.

2. Discussion of the Related Art

The recent advent of information-dependent age has brought about rapid development in the display field that visually displays electrical information signals. In this regard, a variety of flat panel display shaving superior properties such as slimness, low weight and low power consumption have been developed.

Examples of flat panel displays include liquid crystal displays (LCDs), plasma display panels (PDPs), field emission displays (FEDs), organic light emitting displays (OLEDs) and the like.

In particular, an organic light emitting display spontaneously emits light, which has advantages of rapid response speed, superior luminous efficacy, excellent brightness and wide viewing angle, as compared to other flat panel displays. Such an organic light emitting display includes an anode and a cathode which face each other such that a light emitting layer is interposed therebetween. Holes injected from the anode recombine with electrons injected from the cathode in the light emitting layer to form electron-hole pairs, i.e., excitons. Light is emitted by energy generated upon transition of the excitons to a ground state.

In a general organic light emitting display, a configuration in which a blue light emitting layer is formed commonly in red, green and blue sub-pixels by deposition is suggested in order to simplify a fabrication process. However, when the blue light emitting layer is formed in the red and green sub-pixels, upon emission of red and green light from the red and green light emitting layer, blue spectrum is also emitted and color purity of red and green light is disadvantageously deteriorated.

In addition, when a blue light emitting layer formed by a general deposition process contacts a hole transport layer formed by a solution process, lifespan and efficiency of the blue light emitting layer are disadvantageously deteriorated due to surface non-uniformity between an interface of the hole transport layer and an interface of the blue light emitting layer.

SUMMARY OF THE INVENTION

Accordingly, the present invention is directed to an organic light emitting display and a method for fabricating the same that substantially obviate one or more problems due to limitations and disadvantages of the related art.

An object of the present invention is to provide an organic light emitting display and a method for fabricating the same to improve color purity and efficiency.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display includes a substrate having first to third sub-pixels, first and second electrodes formed on the substrate, the first and second electrodes facing each other, a red light emitting layer formed in the first sub-pixel between the first and second electrodes, a green light emitting layer formed in the second sub-pixel between the first and second electrodes, and a blue common light emitting layer formed in the first to third sub-pixels between the first and second electrodes, wherein a thin film layer formed between the first electrode and the blue common light emitting layer and contacting the blue common light emitting layer includes a blue host.

In a first embodiment, the organic light emitting display may further include a buffer layer formed between each of the red light emitting layer of the first sub-pixel, the green light emitting layer of the second sub-pixel and a hole transport layer of the third sub-pixel, and the blue common light emitting layer such that the buffer layer contacts the blue common light emitting layer, wherein the buffer layer includes a blue light emitting host as the blue host and a buffer host.

In a second embodiment, the organic light emitting display may further include a buffer layer formed between each of the red light emitting layer of the first sub-pixel, the green light emitting layer of the second sub-pixel and the hole transport layer of the third sub-pixel, and the blue common light emitting layer such that buffer layer contacts the blue common light emitting layer, wherein the buffer layer includes a blue hole transport host as the blue host and a buffer host, and the blue common light emitting layer includes a blue electron transport host and a blue dopant.

In a third embodiment, the organic light emitting display may further include a hole transport layer formed between each of the red light emitting layer of the first sub-pixel, the green light emitting layer of the second sub-pixel and the blue common light emitting layer of the third sub-pixel, and the hole injection layer, such that hole transport layer contacts the blue common light emitting layer, wherein the blue common light emitting layer includes a blue electron transport host, a blue hole transport host and a blue dopant, and the hole transport layer includes the same blue host as the blue hole transport host.

In another aspect of the present invention, a method for fabricating an organic light emitting display includes forming a first electrode on a substrate having first to third sub-pixels, forming a red light emitting layer in the first sub-pixel by a solution process, forming a green light emitting layer in the second sub-pixel by a solution process, forming a blue common light emitting layer in the first to third sub-pixels by a deposition process, and forming a second electrode by a deposition process such that the second electrode faces the first electrode, wherein a thin film layer formed between the first electrode and the blue common light emitting layer and contacting the blue common light emitting layer includes a blue host.

In a first embodiment, the method may further include forming a buffer layer by a solution process between each of the red light emitting layer of the first sub-pixel, the green light emitting layer of the second sub-pixel and a hole transport layer of the third sub-pixel, and the blue common light emitting layer such that buffer layer contacts the blue common light emitting layer, wherein the buffer layer includes a blue light emitting host as the blue host and a buffer host.

In a second embodiment, the method may further include forming a buffer layer by a solution process between each of the red light emitting layer of the first sub-pixel, the green light emitting layer of the second sub-pixel and the hole transport layer of the third sub-pixel, and the blue common light emitting layer such that the buffer layer contacts the blue common light emitting layer, wherein the buffer layer includes a blue hole transport host as the blue host and a buffer host, and the blue common light emitting layer includes a blue electron transport host and a blue dopant.

In a third embodiment, the method may further include forming a hole transport layer by a solution process between each of the red light emitting layer of the first sub-pixel, the green light emitting layer of the second sub-pixel and the blue common light emitting layer of the third sub-pixel, and the hole injection layer such that the hole transport layer contacts the blue common light emitting layer, wherein the blue common light emitting layer includes a blue electron transport host, a blue hole transport host and a blue dopant, and the hole transport layer includes the same blue host as the blue hole transport host.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and simultaneously with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
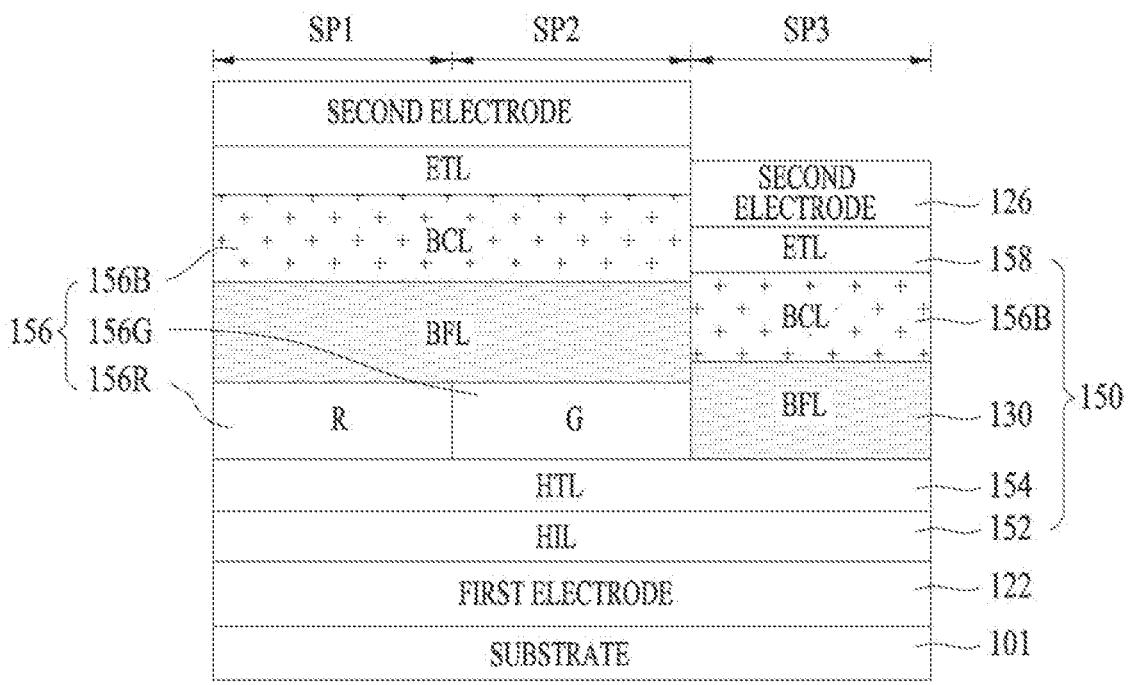
FIG. 1 is a sectional view illustrating anorganic light emitting display according to a first embodiment of the present invention.

FIG. 1 is a sectional view illustrating an organic light emitting display according to the present invention.

The organic light emitting display shown in FIG. 1 includes first to third sub-pixels SP1, SP2 and SP3.

Each of the first to third sub-pixels SP1, SP2 and SP3 includes first and second electrodes 122 and 126 and an organic light emitting layer 150 provided between the first and second electrodes 122 and 126.

One of the first and second electrodes 122 and 126 is implemented with a semi-transmission electrode or a transmission electrode and the other is implemented with a reflection electrode. When the first electrode 122 is a semi-transmission electrode or a transmission electrode and the second electrode 126 is a reflection electrode, the organic light emitting device has a bottom-emission structure in which light is emitted to a lower part. When the second electrode 126 is a semi-transmission electrode or a transmission electrode and the first electrode 122 is a reflection electrode, the organic light emitting device has a top-emission structure in which light is emitted to an upper part. In the present invention, an example in which the first electrode 122 is an anode formed of a reflection electrode and the second electrode 126 is a cathode formed of a transmission electrode is described.

The first electrode 122 has a laminate structure including a non-transparent conductive layer such as aluminum (Al) and a transparent conductive layer such as indium tin oxide (ITO). Here, the non-transparent conductive layer included in the first electrode 122 functions as a reflection electrode which reflects light, which is generated in the organic light emitting layer 150 and travels toward a substrate 101, to the second electrode 126.

The second electrode 126 is formed of a semi-transmission electrode or a transmission electrode provided on the organic light emitting layer 150. Such a second electrode 126 emits light generated in the organic light emitting layer 150 upwardly. The second electrode 126 has a monolayer or multilayer structure formed of a metal, an inorganic substance, a mixture of a metal and a metal, a mixture of a metal and an inorganic substance, or a combination thereof. When each layer is formed of a metal mixture, or a mixture of a metal and an inorganic substance, a mix ratio is 10:1 to 1:10. The metal constituting the second electrode 126 is Ag, Mg, Yb, Li or Ca, and the inorganic substance is $Li_2O$, CaO, LiF or $MgF_2$. As a result, movement of electrons is facilitated and more electrons are thus transported into the light emitting layer 110.

The organic light emitting layer 150 includes a hole injection layer 152, a hole transport layer 154, a light emitting layer 156, a buffer layer 130 and an electron transport layer 158.

The hole injection layer 152 supplies holes from the first electrode 122 to the hole transport layer 154.

The hole transport layer 154 supplies holes from the hole injection layer 152 to a red light emitting layer 156R of a first sub-pixel SP1, a green light emitting layer 156G of a second sub-pixel SP2 and a blue common light emitting layer 156B of a third sub-pixel SP3. The hole transport layer 154 has an triplet energy of about 2.0 to about 2.7 eV which is higher than that of the buffer layer 130 and those of the red and green light emitting layers 156R and 156G and a hole mobility ($\mu_h$) of $1.0 \times 10^{-4}$ to $5.0 \times 10^{-1}$ Cm$^2$/Vs. The hole transport layer 154 has a thickness of 10 to 70 nm.

The electron transport layer 158 supplies electrons from the second electrode 126 to the red light emitting layer 156R, the green light emitting layer 156G and the blue common light emitting layer 156B.

The light emitting layer 156 includes the red light emitting layer 156R, the green light emitting layer 156G and the blue common light emitting layer 156B.

The red light emitting layer 156R includes a red host and a red dopant and is formed on the hole transport layer 154 of the first sub-pixel SP1. Holes supplied through the hole transport layer 154 recombine with electrons supplied through the electron transport layer 158 in the red light emitting layer 156R of the first sub-pixel SP1, thus generating red light.

The green light emitting layer 156G includes a green host and a green dopant and is formed on the hole transport layer 154 of the second sub-pixel SP2. Holes supplied through the hole transport layer 154 recombine with electrons supplied through the electron transport layer 158 in the green light emitting layer 156G of the second sub-pixel SP2, thus generating green light.

Figure 2:
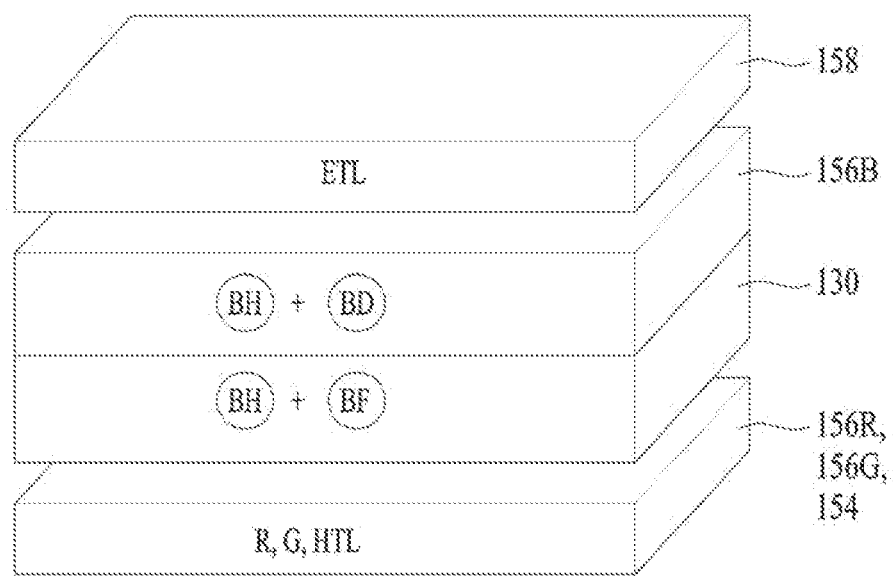
FIG. 2 is a sectional view illustrating the buffer layer and the blue common light emitting layer shown in FIG. 1 in detail.

As shown in FIG. 2, the blue common light emitting layer 156B includes a blue (light emitting) host BH and a blue dopant BD and is formed over the entire surface of the buffer layer 130 of the first to third sub-pixels SP1, SP2 and SP3 such that the blue common light emitting layer 156B is formed commonly in the first to third sub-pixels SP1, SP2 and SP3. As a result, the blue common light emitting layer 156B can be formed by deposition without an additional shadow mask, thus reducing fabrication costs.

Holes supplied through the hole transport layer 154 recombine with electrons supplied through the electron transport layer 158 in the blue light emitting layer 156B of the third sub-pixel SP3, thus generating blue light.

The buffer layer 130 prevents deterioration in life span and efficiency of the blue common light emitting layer 156B of the third sub-pixel SP3 caused by interfacial instability between the hole transport layer 154 formed by a solution process and the blue common light emitting layer 156B formed by a deposition process. For this purpose, as shown in FIG. 2, the buffer layer 130 includes a buffer host BF and a blue (light emitting) host BH and is formed to a thickness of 10 nm to 100 nm.

The buffer host BF includes a single host containing a hole transport material or an electron transport material, or a mixed host containing a mixture of a hole transport material and an electron transport material.

The mixed host is formed of a buffer material including benzimidazole, phenanthroline, 1,3,4-oxadizole, 1,2,4-triazole or the like, and the single host is formed of a hole transport material such as carbazole (dimer, monomer or oligomer), triphenylamine or aryl silane, or an electron transport material such as 1,3,5-triazine, 1,3,4-oxadiazol orphenyl phosphineoxide.

In particular, the buffer layer 130 including the buffer host BF composed of the mixed host has bipolarity, thus improving hole injection capacity from the hole injection layer 152 to the blue common light emitting layer 156B and electron injection capacity from the electron transport layer 158 to the red and green light emitting layers 156R and 156G. The buffer host BF has the following properties as shown in Table 1.

TABLE 1

| | T1 level | HOMO (eV) | LUMO (eV) | Electron mobility ($\mu_e$; cm$^2$/Vs) | Hole mobility ($\mu_h$; cm$^2$/Vs) |
| --- | --- | --- | --- | --- | --- |
| Buffer host as mixed host | 2.0~2.7 | 5.0~6.5 | 2.0~3.5 | $1.0 \times 10^{-9}$~ $1.0 \times 10^{-3}$ | $5 \times 10^{-8}$~ $5.0 \times 10^{-3}$ |
| Buffer host as electron single host | 1.0~2.7 | 5.5~6.5 | 2.2~4.0 | ≥mixed host | ≤mixed host |

The blue light emitting host BH of the buffer layer 130 is formed of a blue compound which is the same as or different from the blue light emitting host BH of the blue common light emitting layer 156B. For example, the blue light emitting host BH of the buffer layer 130 is formed of a phosphorescent material such as carbazole, Firpic, UGH or CBP ora fluorescent material such as BAlq or LiPBO. The blue light emitting host BH of the buffer layer 130 is organically deposited on the buffer layer 130 and a doping concentration thereof is 10 to 50% by weight. The blue light emitting host BH of the buffer layer 130 has a glass transition temperature (Tg) of 100° C. to 300° C. and a highest occupied molecular orbital (HOMO) level of 3.0 to 6.9 ev, a lowest unoccupied molecular orbital (LUMO) level of 2.0 to 4.0 ev and a triplet energy of 1.5 to 2.0 eV.

The blue light emitting host BH of the buffer layer 130 and the blue light emitting host BH of the blue common light emitting layer 156B enable energy to be transported to the blue dopant BD in the blue common light emitting layer 156B, resulting in emission of blue light.

In addition, triplet energies of the red and green light emitting layers 156R and 156G and the buffer layer 130 are lower than the triplet energy of the hole transport layer 154. In this case, transition from the buffer layer 130 to the triplet energy of the hole transport layer 154 can be prevented. As a result, excitons in the buffer layer 130 are not diffused into adjacent thin film layers. Accordingly, emission of blue light is inhibited upon emission of red and green light in the first and second sub-pixels SP1 and SP2, thereby improving luminance and color purity of the red and green light emitting layers 156R and 156G.

FIGS. 3A to 3E are sectional views illustrating a method for fabricating an organic light emitting display according to a first embodiment of the present invention.

Figure 3A:
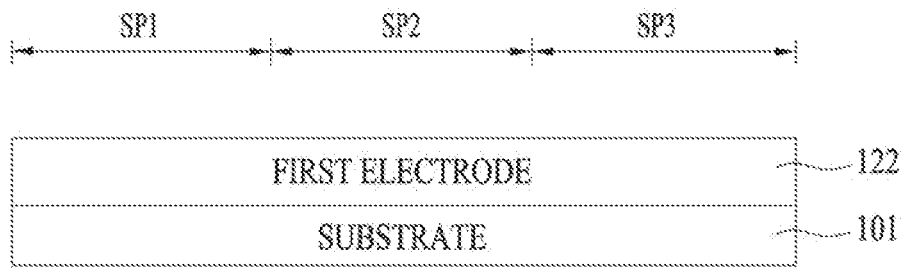
FIGS. 3A to 3E are sectional views illustrating a method for fabricating the organic light emitting display shown in FIG. 1.
Figure 3B:
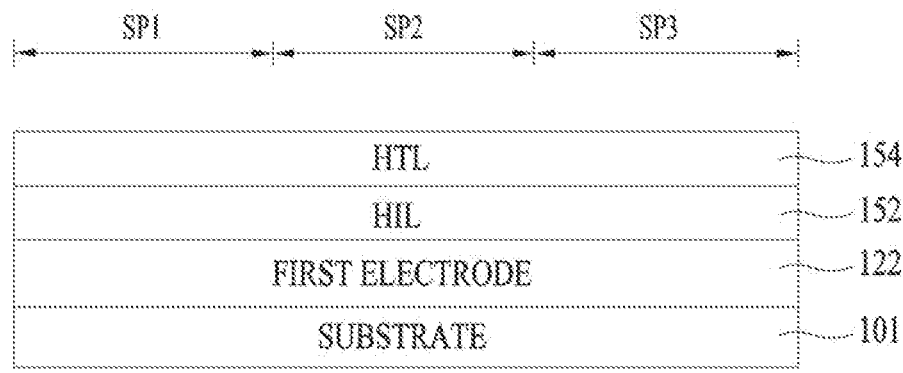
Figure 3C:
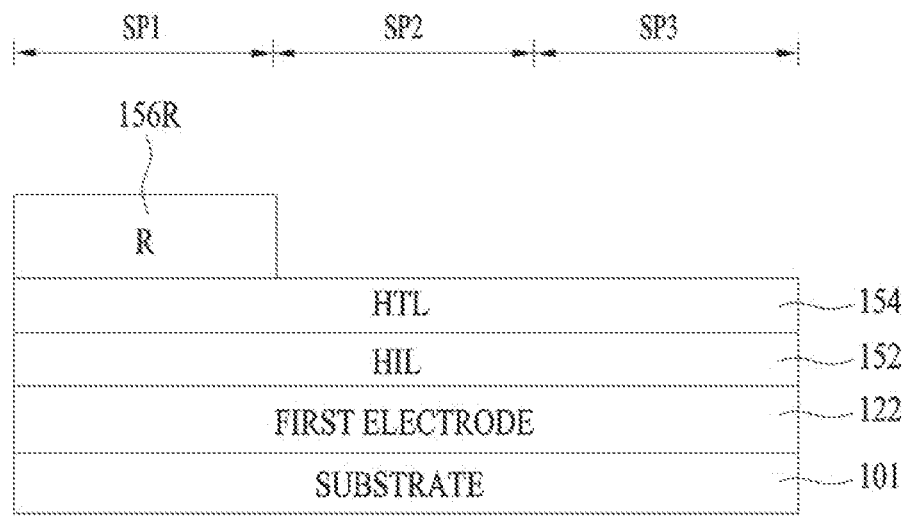
Figure 3D:
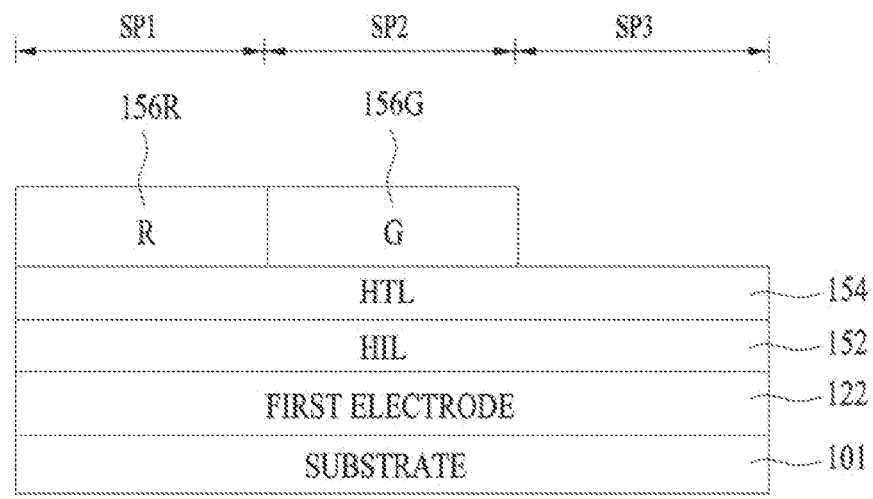
Figure 3E:
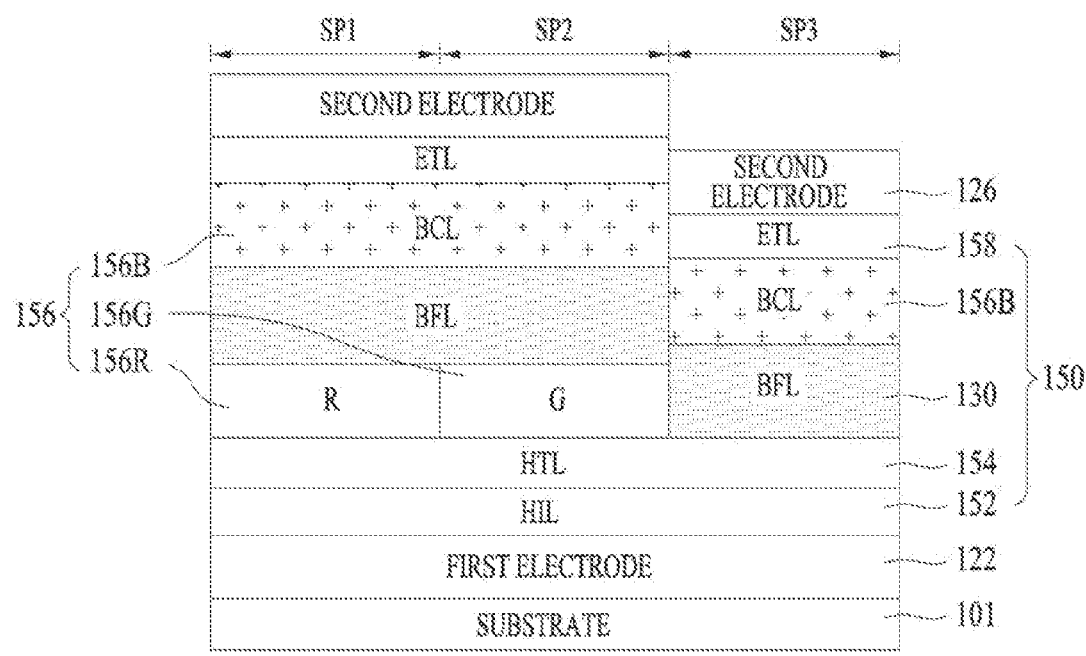

As shown in FIG. 3A, a first electrode 122, in which sub-pixels SP1, SP2 and SP3 are defined, is formed on a substrate 101. The first electrode 122 is patterned by photographic and etching processes to complete formation thereof. Then, as shown in FIG. 3B, a hole injection layer 152 and a hole transport layer 154 are sequentially formed by coating the first to third sub-pixels SP1, SP2 and SP3 on the substrate 101 provided with the first electrode 122 using an inkjet patterning device or a spin coating device. Then, as shown in FIG. 3C, a red light emitting layer 156R is formed by selectively coating in the first sub-pixel SP1 on the substrate 101 provided with the hole transport layer 154 using a liquid coating device. Then, as shown in FIG. 3D, a green light emitting layer 156G is formed by selectively coating in the second sub-pixel SP2 on the substrate 101 provided with the red light emitting layer 156R using a liquid coating device. Then, as shown in FIG. 3E, a buffer layer 130, a blue common light emitting layer 156B, a hole transport layer 158 and a second electrode 126 are sequentially formed by a vapor deposition process using high vacuum without a shadow mask.

As such, the hole injection layer 152, the hole transport layer 154, and the red and green light emitting layers 156R and 156G of the organic light emitting display according to the first embodiment are formed by a solution process such as inkjet patterning method, the buffer layer 130, the blue common light emitting layer 156B, the hole transport layer 158 and the second electrode 126 are formed by a deposition process without using a shadow mask, thereby simplifying a fabrication process and reducing fabrication cost.

Figure 4A:
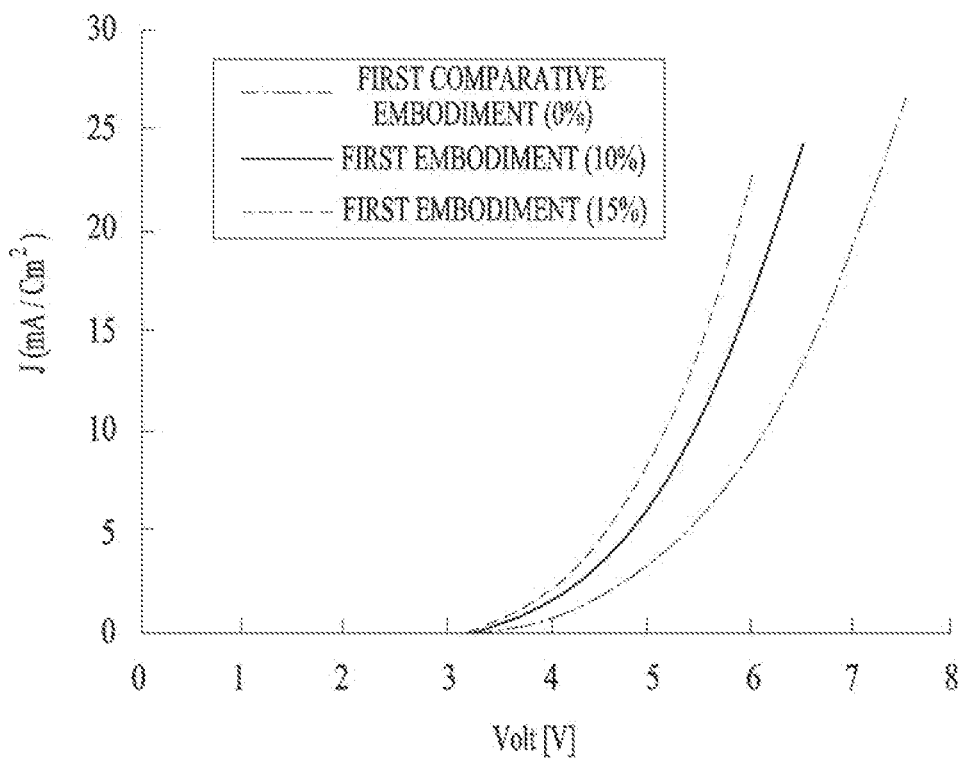
FIGS. 4A to 4C are graphs illustrating comparison in properties between the organic light emitting display according to the first embodiment of the present invention and an organic light emitting display according to a first comparative embodiment.
Figure 4B:
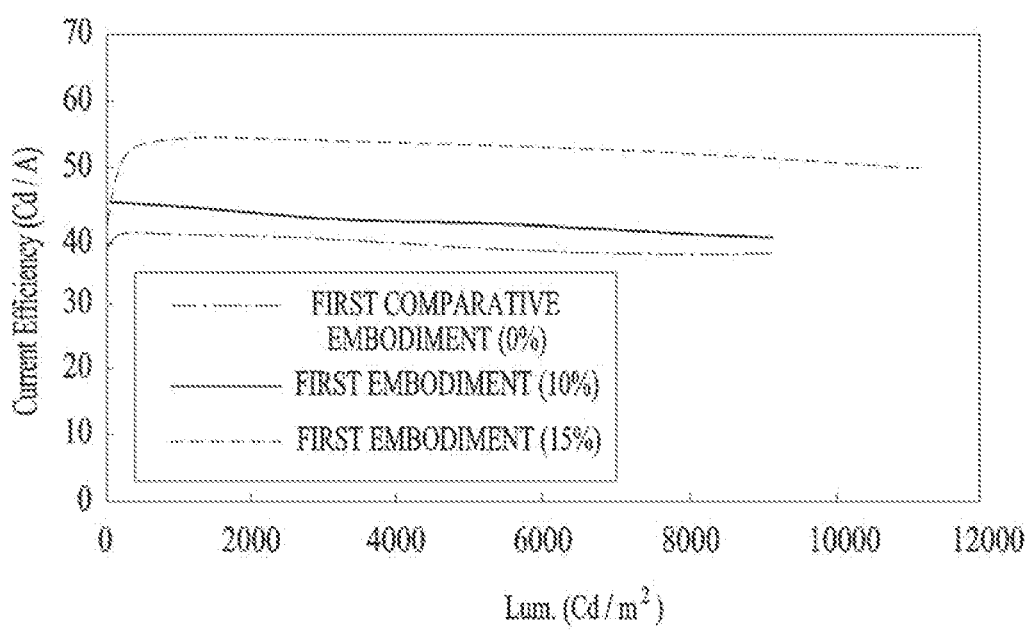
Figure 4C:
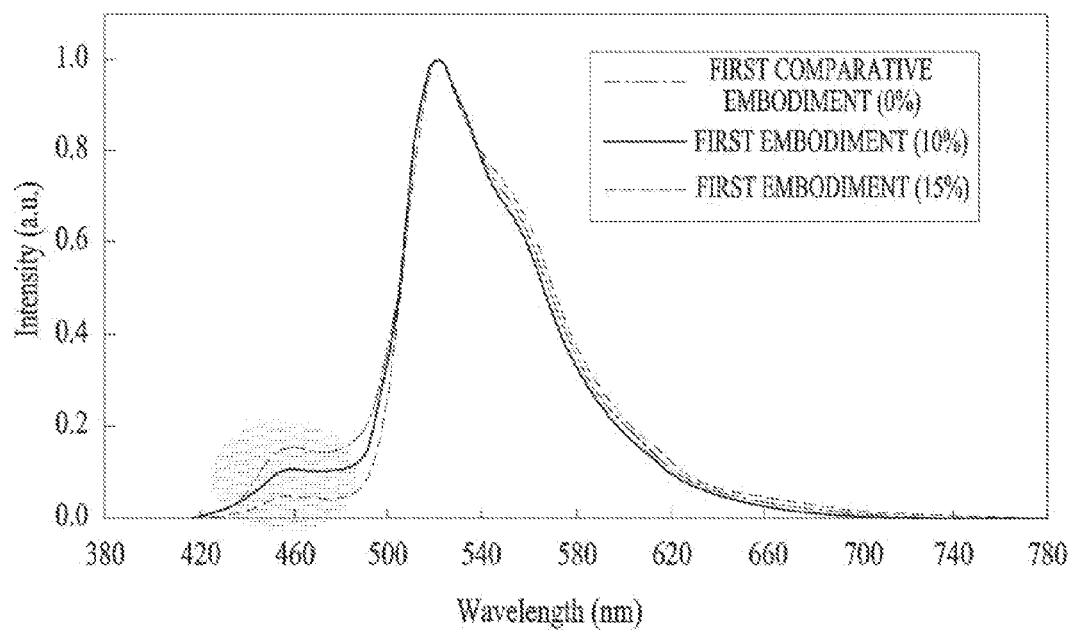

FIGS. 4A to 4C are views illustrating comparison in properties between a second sub-pixel including a green light emitting layer according to a first embodiment of the present invention and a second sub-pixel including a green light emitting layer according to a first comparative embodiment. The first comparative embodiment and the first embodiment of the present invention shown in FIGS. 4A to 4C are obtained by the following method.

First Embodiment

A hole injection layer, a hole transport layer, a red light emitting layer and a green light emitting layer are sequentially coated on a substrate provided with a first electrode by a spin coating solvent method and are then baked for a predetermined time, and a buffer layer including a buffer host containing a mixture composed of 10% or 15% of a blue light emitting host and another host, a blue common light emitting layer, an electron transport layer and a second electrode areorganically deposited under high vacuum to complete fabrication of an organic light emitting display.

First Comparative Embodiment

An organic light emitting display is completed in the same manner as in the first embodiment except that the blue light emitting host is not contained in the buffer layer.

As can be seen from FIGS. 4A and 4B and Table 2, the first embodiment of the present invention exhibits superior efficiency, voltage and color coordinate properties as compared to the first comparative embodiment.

TABLE 2

| | Content of blue light emitting host (wt %) | Efficiency (Cd/A) | Voltage (V) | External quantum efficiency EQE (%) | CIEx | CIEy |
|---|---|---|---|---|---|---|
| First comparative embodiment | 0 | 37.5 | 4.8 | 10.5 | 0.287 | 0.560 |
| First embodiment | 10 | 41.5 | 4.3 | 11.8 | 0.294 | 0.591 |
| | 15 | 51.6 | 4.0 | 13.8 | 0.305 | 0.610 |

That is, as can be seen from Table 2 and FIG. 4A, the organic light emitting display of the first embodiment exhibits at maximum a 0.8V decrease in driving voltage to obtain a predetermined current density due to high current density according to voltage, as compared to that of the first comparative embodiment. In addition, as shown in FIG. 4B, the organic light emitting display according to the first embodiment exhibits a small efficiency decrease with increase in luminance, as compared to that of the first comparative embodiment. In particular, the first embodiment having a buffer layer 130 including a blue light emitting host BH, as shown in FIG. 4C, exhibits a low blue luminescence peak (430~460 nm) in the green light emitting layer 156G, as compared to that of the first comparative embodiment. In addition, as content of the blue light emitting host BH in the buffer layer 130 increases, a blue luminescence peak (430~460 nm) in the greenlight emitting layer 156G decreases and charge uniformity thus improves.

Figure 5:
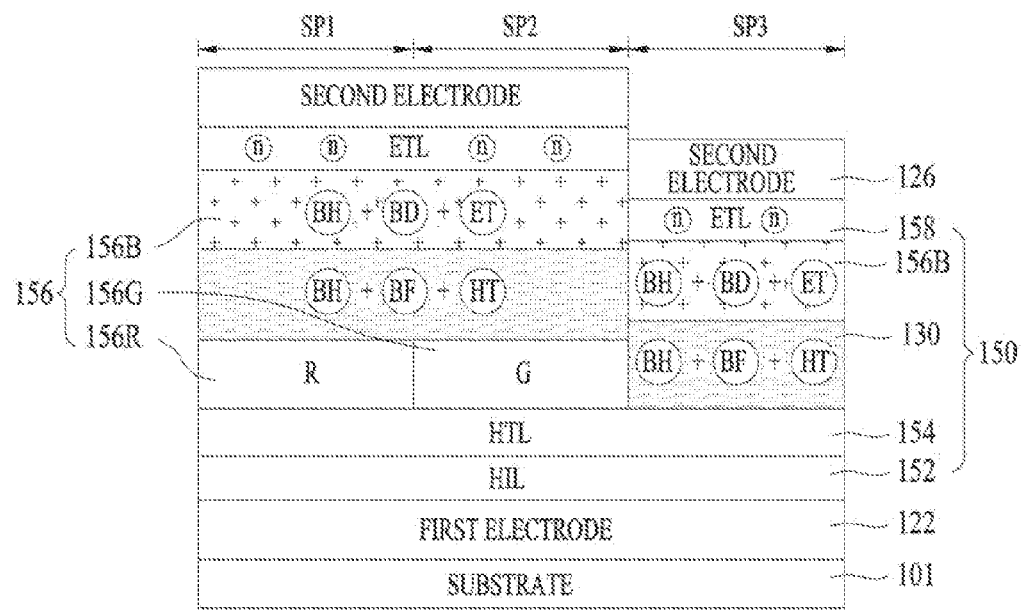
FIG. 5 is a sectional view illustrating an organic light emitting display according to a second embodiment of the present invention.

FIG. 5 is a sectional view illustrating an organic light emitting display according to a second embodiment of the present invention.

The organic light emitting display shown in FIG. 5 includes the same elements as the organic light emitting display according to the first embodiment, except that the organic light emitting display according to the second embodiment includes a buffer layer 130 including a blue hole transport host, a blue common light emitting layer 156B including a blue electron transport host and an electron transport layer 158 including an n-type dopant. Accordingly, a detailed explanation of the same elements is omitted.

The blue common light emitting layer 156B is formed over the entire surface of the buffer layer 130 in the first to third sub-pixels SP1, SP2 and SP3 and is formed commonly in the first to third sub-pixels SP1, SP2 and SP3. The blue common light emitting layer 156B can be formed by deposition without using an additional shadow mask, thus reducing fabrication costs. Holes supplied through the hole transport layer 154 recombine with electrons supplied through the electron transport layer 158 in the blue light emitting layer 156B of the third sub-pixel SP3, thus generating blue light.

The blue common light emitting layer 156B includes a blue electron transport host, which is the same as or different from that of the electron transport layer 158, and 2 to 20% by weight of a blue dopant (BD). The blue electron transport host comprises a single material, or a mixture of a blue light emitting host BH and an electron transport host ET. For example, the blue electron transport host present as the single material is 1,3,5-tri(m-pyrid-3-yl-phenyl)benzene [TmPyPb], or 2-(diphenylphosphoryl)spirofluorene, and the electron transport host ET used for the mixture is 1,3,5-triazine, 1,3,4-oxadiazolorphenyl phosphineoxide, the blue light emitting host BH for the blue common light emitting layer 156B is a phosphorescent material such as carbazole, Firpic, UGH or CBP, or a fluorescent material such as BAlq or LiPBO. The blue electron transport host (ET) in the blue common light emitting layer 156B efficiently transports electrons from the electron transport layer 158 to the red and green light emitting layers 156R and 156G.

The electron transport layer 158 supplies electrons from the second electrode 126 to the red light emitting layer 156R, the greenlight emitting layer 156G and the blue common light emitting layer 156B. The electron transport layer 158 is doped with 0 to 10% of an n-type dopant selected from a compound of an alkali metal, an alkaline earth metal, carbonate and a transition metal or a compound containing an ion such as —BF$_4$, —PF$_4$, —Li, —Na, —K, Rb or Cs. For example, the electron transport layer 158 is doped with ann-type dopant such as NaHCO$_3$, which is easy to handle at room temperature. When the electron transport layer 158 is doped with ann-type dopant, the number of electrons in the electron transport layer 158 increases, electron injection barrier lowers and movement of electrons is thus facilitated.

The buffer layer 130 prevents deterioration in lifespan and efficiency of the blue common light emitting layer 156B of the third sub-pixel SP3 which is caused by interfacial instability between the hole transport layer 154 formed by a solution process and the blue common light emitting layer 156B formed by a deposition process. For this purpose, the buffer layer 130 is formed to a thickness of 10 nm to 100 nm and includes a buffer host (BF) and 2 to 10% by weight of a blue hole transport host.

The buffer host BF comprises a single host including either a hole host or an electron host, or a mixed host including a mixture of a hole host and an electron host. In particular, the buffer layer 130 including the buffer host BF composed of the mixed host has bipolarity, thus improving hole injection capacity from the hole injection layer 152 to the blue common light emitting layer 156B and electron injection capacity from the electron transport layer 158 to the red and green light emitting layers 156R and 156G.

The blue hole transport host of the buffer layer 130 is formed of a hole transport material which is the same as or different from that of the hole transport layer 154 to effectively improve transport of holes from the hole transport layer 154 to the blue common light emitting layer 156B. The blue hole transport host may comprise a single material or a mixture of a blue light emitting host BH and a hole transport host HT. For example, the blue hole transport host present as the single material is N,N'-dicarbazolyl-3,5-benzene or 4,4',4"-tris(N-carbazolyl) triphenylamine[TCTA] and the hole transport host (HT) present as the mixture comprises a hole transport host such as carbazole (dimer, monomer or oligomer), triphenylamine or aryl silane.

The blue light emitting host BH of the buffer layer 130 includes a blue compound which is the same as or different from the blue light emitting host BH of the blue common light emitting layer 156B. For example, the blue light emitting host BH of the buffer layer 130 is a phosphorescent material such as carbazole, Firpic, UGH or CBP, or is a fluorescent material such as BAlq or LiPBO.

The blue light emitting host BH of the buffer layer 130 is organically deposited on the buffer layer 130 and a doping concentration thereof is 2 to 10% by weight. The blue light emitting host BH of the buffer layer 130 has a glass transition temperature (Tg) of 100° C. to 300° C. and a highest occupied molecular orbital (HOMO) level of 3.0 to 6.9 eV, a lowest unoccupied molecular orbital (LUMO) level of 2.0 to 4.0 eV and a triplet energy of 1.5 to 2.0 eV. The blue light emitting host BH of the buffer layer 130 and the blue light emitting host BH of the blue common light emitting layer 156B enable energy to be transported to the blue dopant BD in the blue common light emitting layer 156B, resulting in emission of blue light. Accordingly, emission of blue light is inhibited upon emission of red and green light in the first and second sub-pixels SP1 and SP2, thereby improving luminance and color purity of the red and green light emitting layers 156R and 156G.

The buffer layer 130 is formed such that it has properties different from the hole transport layer 154 contacting the buffer layer 130, as shown in Table 3, thus preventing excitons from quenching in the hole injection layer 152.

TABLE 3

| | T1 level | HOMO (eV) | LUMO (eV) | Electron mobility ($\mu_e$; cm$^2$/Vs) | Hole mobility ($\mu_h$; cm$^2$/Vs) | Glass transition temperature (Tg, ° C.) |
|---|---|---|---|---|---|---|
| Hole transport layer | 2.1~2.9 | 5.0~6.5 | 2.1~3.5 | | $1.0 \times 10^{-4}$~$5.0 \times 10^{-1}$ | 140~250 |
| Buffer layer | | 5.3~6.3 | 2.2~3.2 | $1.0 \times 10^{-9}$~$1.0 \times 10^{-5}$ | $5 \times 10^{-5}$~$5.0 \times 10^{-3}$ | |

As such, in the second embodiment of the present invention, injection of holes and electrons into the blue common light emitting layer 156B can be facilitated through the blue hole transport host contained in the buffer layer 130, the blue electron transport host contained in the blue common light emitting layer 156B, and the n-type dopant doped in the electron transport layer 158. Accordingly, in the second embodiment of the present invention, holes recombine with electrons in the center of the blue common light emitting layer 156B, thereby improving lifespan and luminous efficiency of the blue common light emitting layer 156B.

Meanwhile, in accordance with the organic light emitting display according to the second embodiment of the present invention, the hole injection layer 152, the hole transport layer 154 and the red and green light emitting layers 156R and 156G are formed using a liquid coating device, and the buffer layer 130, the blue common light emitting layer 156B, the hole transport layer 158 and the second electrode 126 are formed by a deposition process without using a shadow mask. Accordingly, the organic light emitting display according to the second embodiment of the present invention can simplify a fabrication process and reduce a fabrication cost.

Figure 6A:
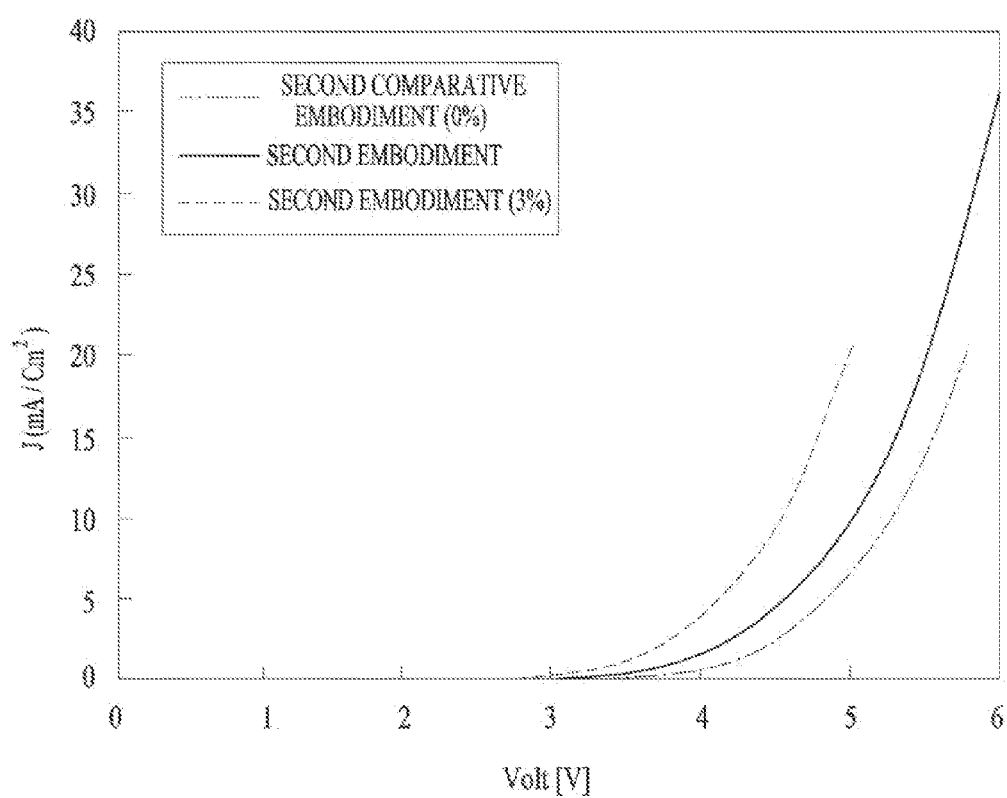
FIGS. 6A to 6C are graphs illustrating comparison in properties between the organic light emitting display according to the second embodiment of the present invention and an organic light emitting display according to a second comparative embodiment.
Figure 6B:
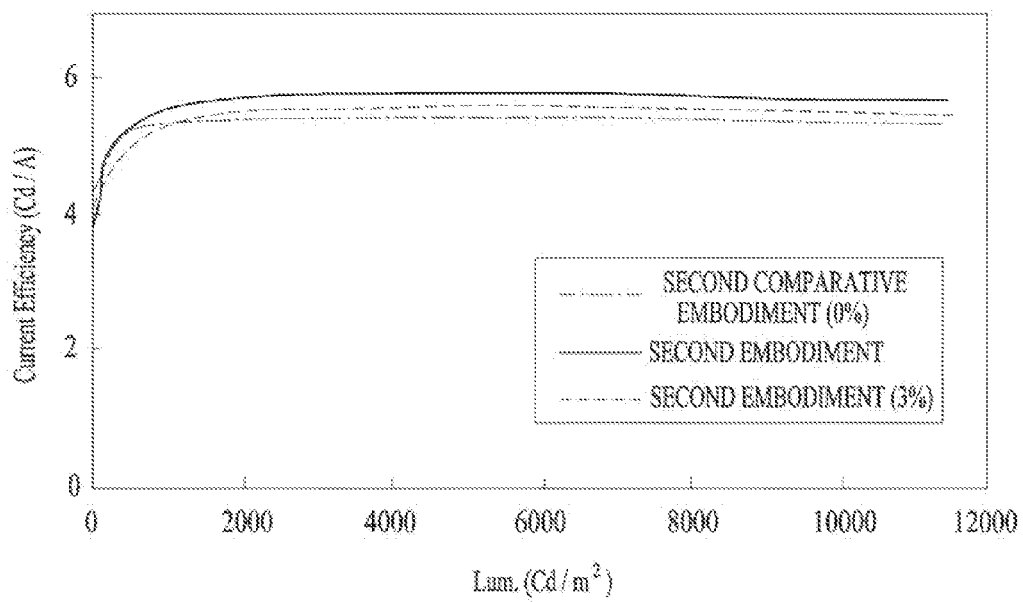
Figure 6C:
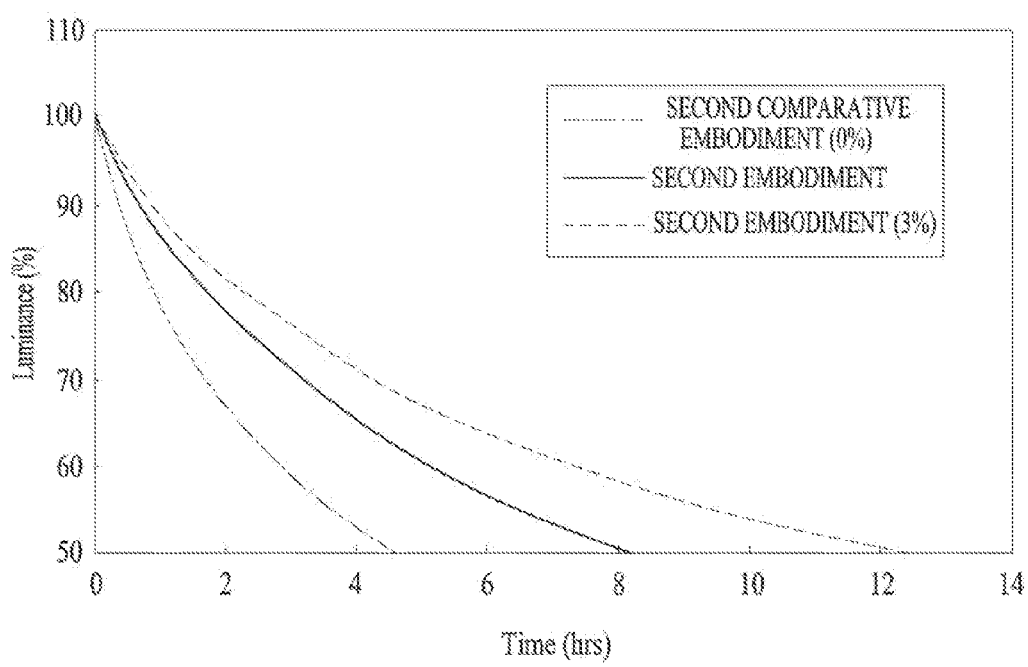

FIGS. 6A to 6C are views illustrating comparison in properties between a second sub-pixel including a green light emitting layer according to the second embodiment of the present invention and a second sub-pixel including a green light emitting layer according to the second comparative embodiment. The second comparative embodiment and the second embodiment of the present invention shown in FIGS. 6A to 6C are obtained by the following method.

Second Embodiment

A hole injection layer, a hole transport layer, a red light emitting layer and a green light emitting layer are sequentially coated on a substrate provided with a first electrode by a spin coating solvent method and are then baked for a predetermined time, and a buffer layer including a hole transport host and a blue light emitting host, a blue common light emitting layer including an electron transport host, a blue light emitting host and a blue dopant, an electron transport layer and a second electrode are organically deposited at high vacuum to complete fabrication of an organic light emitting display. The buffer layer is co-deposited with 5% of TCTA as the blue hole transport host, TmPyPb is used as the blue electron transport host for the blue light emitting layer, Firpic is doped in an amount of 5% as the blue dopant and the electron transport layer is doped with 0 to 3% of an n-type dopant such as $NaHCO_3$.

Second Comparative Embodiment

An organic light emitting display is fabricated in the same manner as in the second embodiment, except that the buffer layer is not included and the blue light emitting common layer is formed using TCTA:TmPyPb as a blue light emitting host and a blue dopant doped with 5% of Firpic.

As can be seen from FIGS. 6A and 6B and Table 4, the second embodiment of the present invention exhibits superior efficiency, voltage and lifespan coordinate properties as compared to the second comparative embodiment.

TABLE 4

|  |  | Ex. 2 |  |
| --- | --- | --- | --- |
| Buffer layer (doping conc. %) | Comp. Ex. 2 | TCTA(5%) | TCTA(5%) |
| Blue light emitting common layer(host) | TCTA: TmPyPb | TmPyPb | TmPyPb |
| Electron transport layer (doping conc. %) |  |  | $NaHCO_3$ (3%) |
| Current density (mA/cm$^2$) | 10 | 10 | 10 |
| Driving voltage (V) | 5.7 | 5.4 | 4.9 |
| Luminous efficiency (Cd/A) | 5.4 | 5.8 | 5.6 |
| CIEx | 0.137 | 0.137 | 0.137 |
| CIEy | 0.097 | 0.095 | 0.097 |
| T95(life span hrs)1,000 nit | 0.2 | 0.3 | 0.35 |

In particular, as can be seen from Table 4 and FIG. 6A, the organic light emitting display of the second embodiment exhibits at maximum a 0.8V decrease in driving voltage to obtain a predetermined current density at 10 mA/cm$^2$ due to high current density according to voltage, as compared to that of the second comparative embodiment. In addition, as shown in FIG. 6B, the organic light emitting display according to the second embodiment exhibits a small efficiency decrease with increase in luminance, as compared to that of the second comparative embodiment. In addition, as shown in Table 4 and FIG. 6C, the organic light emitting device of the second comparative embodiment exhibits a time until which lifespan reaches 95%, of 0.2 hours, while the organic light emitting device according to the present invention exhibits a time until which lifespan reaches 95%, of at maximum 0.35 hours which is longer than a conventional case.

Figure 7:
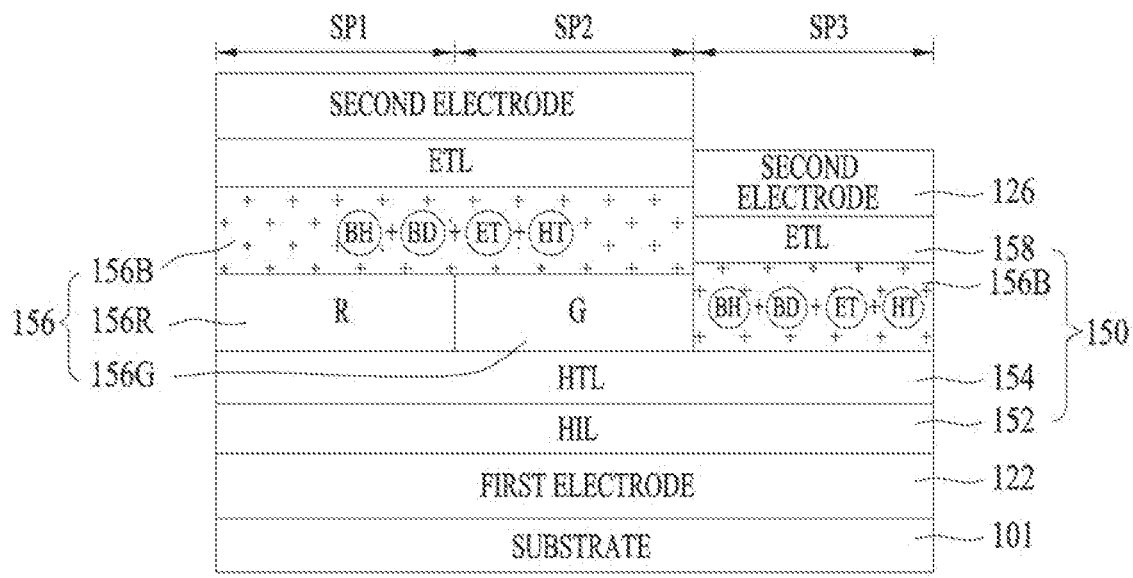
FIG. 7 is a sectional view illustrating an organic light emitting display according to a third embodiment of the present invention.

FIG. 7 is a sectional view illustrating an organic light emitting display according to a third embodiment of the present invention.

The organic light emitting display shown in FIG. 7 has the same configuration, except that the blue common light emitting layer 156B directly contacts the hole transport layer 154 without the buffer layer. Accordingly, a detailed explanation of the same elements is omitted.

The blue common light emitting layer 156B is formed to a thickness of 5 to 200 nm and includes a blue electron transport host, a blue hole transport host and a blue dopant. A doping content ratio of the hole transport host and the electron transport host in the blue common light emitting layer 156B is 1:1 to 1:10 and a doping concentration of the blue dopant BD in the blue common light emitting layer 156B is 1 to 20% by weight.

The blue electron transport host comprises a single material, or a mixture of a blue light emitting host BH and an electron transport host ET. For example, the blue electron transport host present as the single material comprises an electron transport material such as 1,3,5-tri(m-pyrid-3-ylphenyl)benzene[TmPyPb] or 2-(diphenylphosphoryl)spirofluorene, and the electron transport host present as the mixture comprises an electron transport material such as 1,3,5-triazine,1,3,4-oxadiazolorphenyl phosphineoxide, and the blue light emitting host BH of the blue common light emitting layer 156B comprises a phosphorescent material such as carbazole, Firpic, UGH or CBP, or a fluorescent material such as BAlq or LiPBO. The blue electron transport host ET in the blue common light emitting layer 156B efficiently improves transport of electrons from the electron transport layer 158 to the red and green light emitting layers 156R and 156G.

The blue hole transport host comprises the same material as the host of the hole transport layer 154 contacting the blue common light emitting layer 156B. The blue hole transport host comprises a single material, or a mixture of a blue light emitting host BH and a hole transport host HT. For example, the blue hole transport host present as the single material is N,N'-dicarbazolyl-3,5-benzene or 4,4',4"-tris(N-carbazolyl) triphenylamine[TCTA], and the hole transport host HT present as the mixture is a hole transport material such as carbazole (di-, mono-, or oligomer), triphenylamine or aryl silane. The blue hole transport host effectively transports holes from the hole transport layer 154 to the blue common light emitting layer 156B.

The blue light emitting host BH comprises a phosphorescent material such as carbazole, Firpic, UGH or CBP or a fluorescent material such as BAlq or LiPBO.

Figure 8:
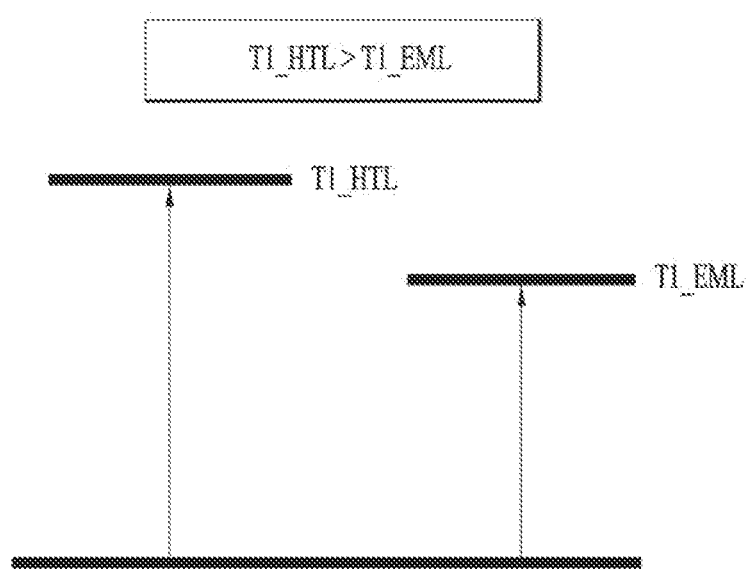
FIG. 8 is a view illustrating relation a triplet energy of the hole transport layer shown in FIG. 7 and a triplet energy of the light emitting layer.

The hole transport layer 154 is formed to a thickness of 5 nm to 70 nm and directly contacts the blue common light emitting layer 156B. The hole transport layer 154 includes the same hole transport host as the blue common light emitting layer 156B. In this case, the hole transport host of the hole transport layer 154 has a triplet energy of 2.0 to 3.0 eV which is higher than a triplet energy of the blue common light emitting layer 156B (T1_EML). Accordingly, as shown in FIG. 8, the triplet energy of the blue common light emitting layer 156B (T1_EML) is lower than the triplet energy of the hole transport layer 154 (T1_HTL). In this case, when the difference between the triplet energy of the hole transport layer 154 (T1_HTL) and the triplet energy of the blue common light emitting layer 156B (T1_EML) increases, transition from the blue common light emitting layer 156B to the triplet energy of the hole transport layer 154 can be prevented. Accordingly, excitons in the blue common light emitting layer 156B remain in the blue common light emitting layer 156B, instead of being diffused to the hole transport layer 154, thus contributing to recombination between holes and electrons and improving luminous efficiency and color purity of the blue common light emitting layer 156B.

As such, the organic light emitting display according to the third embodiment of the present invention effectively improves transport of holes and electrons, has an increased recombination area in the light emitting layer and thus a lengthened lifespan, because the blue electron transport host and the blue hole transport host are present in the blue common light emitting layer 156B. In addition, the organic light emitting display according to the third embodiment improves hole transport capacity and enhances driving voltage and color purity upon emission of blue light, because the blue common light emitting layer 156B and the hole transport layer 154 have the same blue hole transport host.

Meanwhile, in accordance with the organic light emitting display according to the third embodiment, the hole injection layer 152, the hole transport layer 154, and the red and green light emitting layers 156R and 156G are formed by a solution process using a liquid coating device, and the blue common light emitting layer 156B, the hole transport layer 158 and the second electrode 126 are formed by a deposition process without using a shadow mask. Accordingly, the organic light emitting display according to the third embodiment can simplify a fabrication process and reduce a fabrication cost.

Figure 9A:
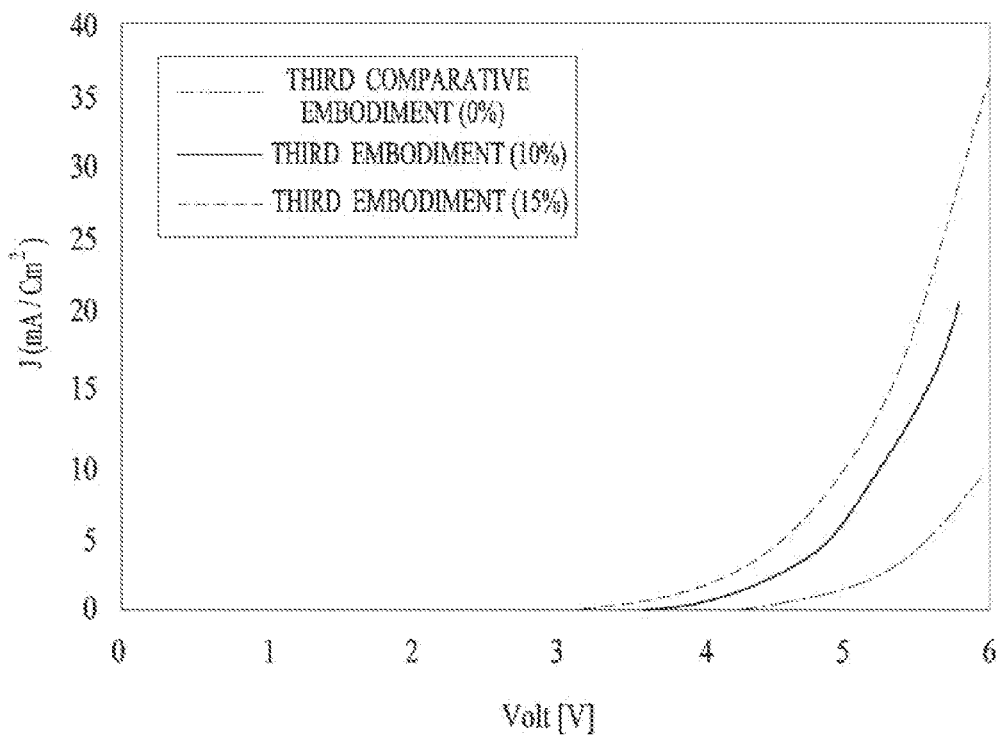
FIGS. 9A to 9C are graphs illustrating comparison in properties between a third sub-pixel including a blue light emitting layer according to a third embodiment of the present invention and a third sub-pixel including a blue light emitting layer according to a third comparative embodiment.
Figure 9B:
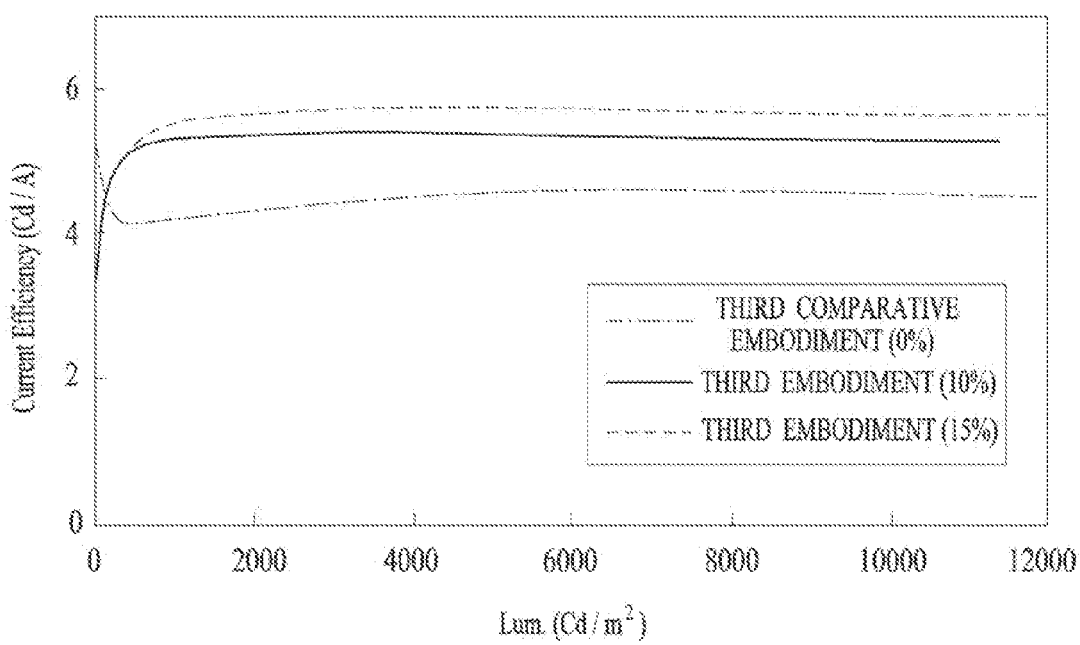
Figure 9C:
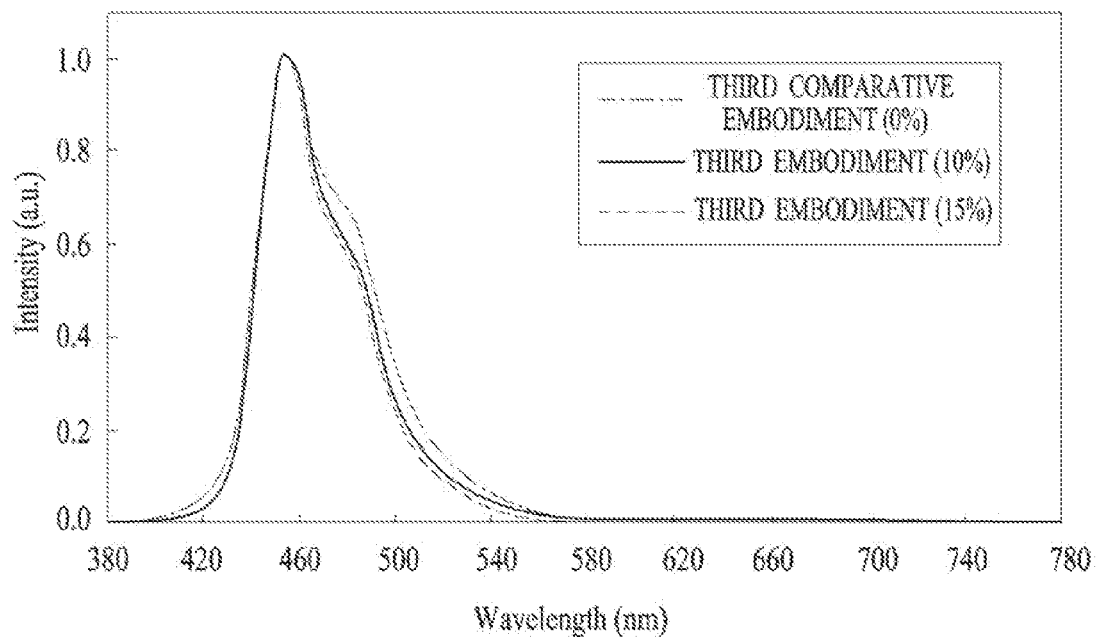

FIGS. 9A to 9C are views illustrating comparison in properties between a third sub-pixel including a blue light emitting layer according to a third embodiment of the present invention and a third sub-pixel including a blue light emitting layer according to a third comparative embodiment. The third comparative embodiment and the third embodiment of the present invention shown in FIGS. 9A to 9C are obtained by the following method.

Third Embodiment

A hole injection layer, a hole transport layer, a red light emitting layer and a green light emitting layer are sequentially coated on a substrate provided with a first electrode by a spin coating solvent method and are then baked for a predetermined time, and a blue common light emitting layer including an electron transport host, a hole transport host and a blue dopant, an electron transport layer and a second electrode are organically deposited at a high vacuum to complete fabrication of an organic light emitting display. In this case, TCTA is used as the hole transport host of the blue light emitting layer, TmPyPb is used as the electron transport host, 10% to 15% of Firpic is doped as the blue dopant, and TCTA, which is the same as the hole transport host of the blue light emitting layer, is used as the hole transport layer.

Third Comparative Embodiment

An organic light emitting display is fabricated in the same manner as in the third embodiment except that TCTA is used as the hole transport host of the blue light emitting layer, TmPyPb is used as the electron transport host, 10% of Firpic is doped as the blue dopant, and the hole transport layer is formed using NPB which is different from the hole transport host of the blue light emitting layer.

As can be seen from FIGS. 9A to 9C, the third sub-pixel having a blue light emitting layer according to the third embodiment of the present invention exhibits superior efficiency, voltage, lifespan properties as compared to that of the third comparative embodiment. In particular, as shown in FIG. 9A, the organic light emitting display of the third embodiment exhibits a decrease in driving voltage to obtain a constant current density due to high current density according to voltage, as compared to that of the third comparative embodiment. This means that the present invention exhibits a lower driving voltage than a conventional case. In addition, as shown in FIG. 6B, the organic light emitting display according to the third embodiment exhibits a small efficiency decrease with increase in luminance, as compared to that of the third comparative embodiment.

Figure 10A:
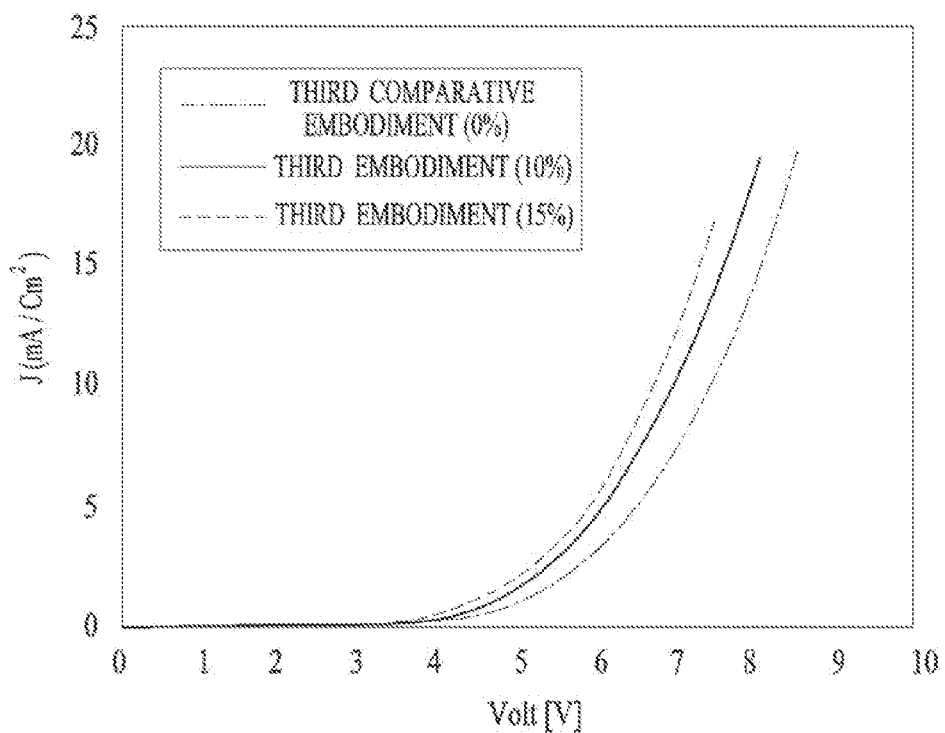
FIGS. 10A to 10C are views illustrating comparison in properties between a second sub-pixel including a green light emitting layer according to the third embodiment of the present invention and a second sub-pixel including a green light emitting layer according to a third comparative embodiment.
Figure 10B:
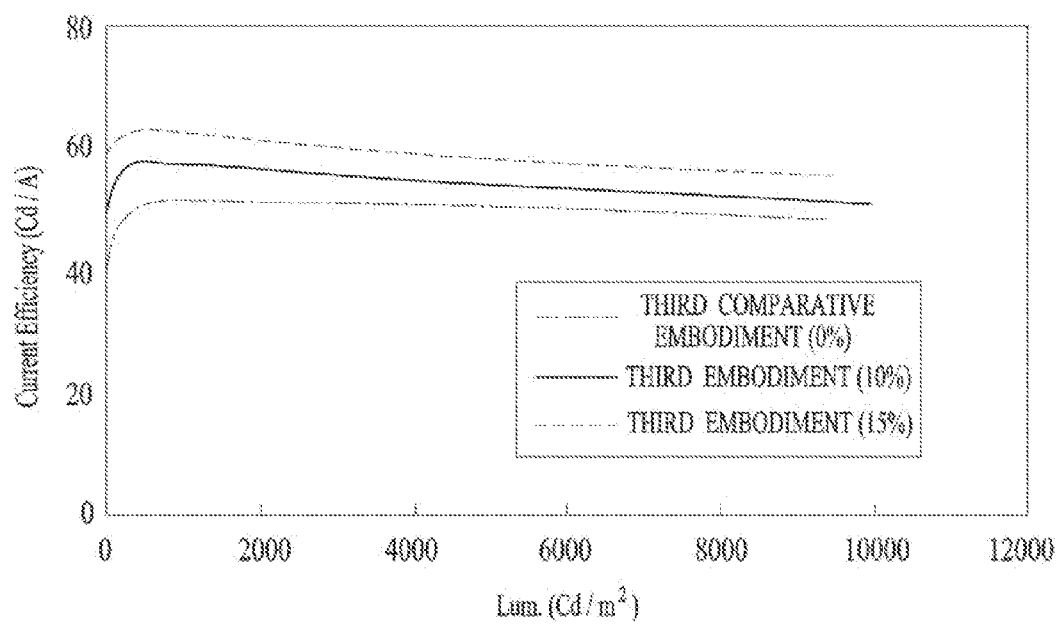
Figure 10C:
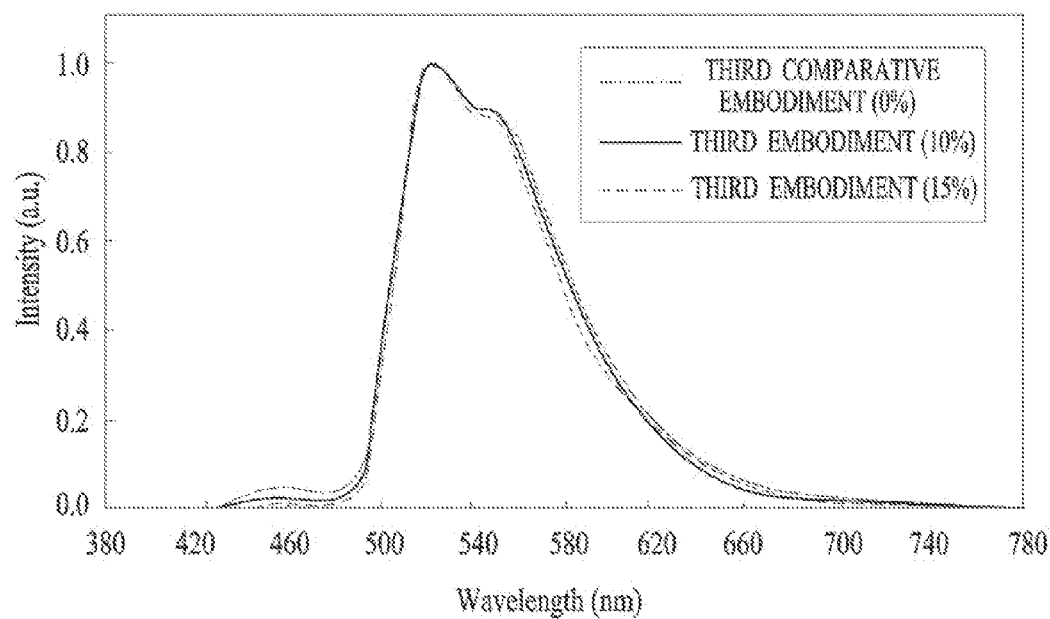

FIGS. 10A to 10C are views illustrating comparison in properties between a second sub-pixel including a green light emitting layer according to the third embodiment of the present invention and a second sub-pixel including a green light emitting layer according to the third comparative embodiment. The third comparative embodiment and the third embodiment of the present invention in FIGS. 10A to 10C are obtained by the same method as the fabrication method of the organic light emitting display used for experiment with reference to FIGS. 9A to 9C.

As can be seen from FIGS. 10A to 10C and Table 5 below, the second sub-pixel having a green light emitting layer according to the third embodiment of the present invention exhibits superior efficiency, voltage and lifespan properties as compared to that of the third comparative embodiment.

TABLE 5

| | Hole transport layer | Blue light emitting host | Blue dopant (%) | Current density (mA/cm$^2$) | Driving voltage (V) | Luminous efficiency (Cd/A) | CIEx | CIEy |
|---|---|---|---|---|---|---|---|---|
| Comp. Ex.3 | NPB | TCTA: TmPyPb | 10 | 10 | 5.5 | 50.6 | 0.346 | 0.592 |
| Ex. 3 | TCTA | | 10 | | 5.0 | 56.5 | 0.347 | 0.603 |
| Ex. 3 | TCTA | | 15 | | 4.8 | 61.4 | 0.347 | 0.612 |

In particular, as can be seen from Table 5 and FIG. 10A, the organic light emitting display of the third embodiment exhibits at maximum a 0.7V decrease in driving voltage to obtain current density at 10 mA/cm$^2$ due to high current density according to voltage, as compared to that of the third comparative embodiment. In addition, as shown in Table 5 and FIG. 10B, the organic light emitting display according to the third embodiment exhibits a small efficiency decrease with increase in luminance, as compared to that of the third comparative embodiment. In addition, as shown in FIG. 9C, the organic light emitting device of the third embodiment exhibits a low blue luminescence peak (430~460 nm) in the green light emitting layer 156G, as compared to that of the third comparative embodiment. In addition, as content of a blue dopant BD in the blue common light emitting layer 156B increases, a blue luminescence peak (430~460 nm) in the green light emitting layer decreases.

As apparent from the fore-going, the organic light emitting display according to the first embodiment of the present invention includes a blue light emitting host in the buffer layer, thus reducing emission of blue light upon emission of red and green light and improving luminance and color purity of red and green light emitting layers. In addition, the organic light emitting display according to the second embodiment of the present invention enables easy injection of holes and electrons to the blue common light emitting layer through the blue hole transport host contained in the buffer layer, the blue electron transport host contained in the blue common light emitting layer and the n-type dopant doped in the electron transport layer. Accordingly, in accordance with the second embodiment of the present invention, holes recombine with electrons in the center of the blue common light emitting layer, thus improving lifespan and luminous efficiency of blue common light emitting layer. Furthermore, the organic light emitting display according to the third embodiment includes a blue electron transport host and a blue hole transport host in the blue common light emitting layer, thus effectively facilitating transport of holes and electrons, increasing a recombination area in the light emitting layer and enhancing luminous efficiency and lifespan. In addition, the organic light emitting display according to the third embodiment include a blue common light emitting layer and a hole transport layer include the same blue hole transport host, thus improving hole transport capacity and enhancing driving voltage and color purity upon emission of blue light.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display comprising:
   a substrate having first to third sub-pixels;
   first and second electrodes formed on the substrate, the first and second electrodes facing each other;
   a red light emitting layer formed in the first sub-pixel between the first and second electrodes;
   a green light emitting layer formed in the second sub-pixel between the first and second electrodes; and
   a blue common light emitting layer formed in the first to third sub-pixels between the first and second electrodes,
   wherein a thin film layer formed between the first electrode and the blue common light emitting layer and contacting the blue common light emitting layer comprises a blue host.

2. The organic light emitting display according to claim 1, further comprising:
   a hole injection layer on the first electrode;
   a hole transport layer on the hole injection layer; and
   a buffer layer formed between each of the red light emitting layer of the first sub-pixel, the green light emitting layer of the second sub-pixel and the hole transport layer of the third sub-pixel, and the blue common light emitting layer such that the buffer layer contacts the blue common light emitting layer,
   wherein the buffer layer comprises a blue light emitting host as the blue host and a buffer host.

3. The organic light emitting display according to claim 2, wherein the hole transport layer has a triplet energy higher than triplet energies of the red and green light emitting layers, and
   wherein a content of the blue light emitting host in the buffer layer is 10 to 15% by weight.

4. The organic light emitting display according to claim 2, wherein the blue common light emitting layer comprises a blue light emitting host,
   the blue light emitting host in the buffer layer is the same as or different from the blue light emitting host in the blue common light emitting layer and comprises a phosphorescent material including carbazole, Firpic, UGH or CBP, or a fluorescent material including BAlq or LiPBO,
   the buffer host is a single host including a hole transport material or an electron transport material, or a mixed host including a mixture of the hole transport material and the electron transport material, and
   the mixed host comprises a buffer material including benzimidazole, phenanthroline, 1,3,4-oxadizole or 1,2,4-triazole and the single host comprises the hole transport material including carbazole (dimer, monomer or oligomer), triphenylamine or aryl silane, or the electron transport material including 1,3,5-triazine, 1,3,4-oxadiazolorphenyl phosphineoxide.

5. The organic light emitting display according to claim 1, further comprising a buffer layer formed between each of the red light emitting layer of the first sub-pixel, the green light emitting layer of the second sub-pixel and the hole transport layer of the third sub-pixel, and the blue common light emitting layer such that buffer layer contacts the blue common light emitting layer,
   wherein the buffer layer comprises a blue hole transport host as the blue host and a buffer host,
   the blue common light emitting layer comprises a blue electron transport host and a blue dopant, and
   a content of the blue electron transport host in the blue common light emitting layer is 2 to 20% by weight.

6. The organic light emitting display according to claim 5, wherein the blue hole transport host comprises a single material, or a mixture of a blue light emitting host and a hole transport host,
   the blue hole transport host present as the single material comprises N,N'-dicarbazolyl-3,5-benzene or 4,4',4"-tris(N-carbazolyl) triphenylamine[TCTA], and
   the hole transport host present as the mixture comprises carbazole (dimer, monomer or oligomer), triphenylamine or aryl silane, and
   wherein the blue electron transport host comprises a single material, or a mixture of a blue light emitting host and an electron transport host,
   the blue electron transport host present as the single material comprises 1,3,5-tri(m-pyrid-3-yl-phenyl)benzene [TmPyPb] or 2-(diphenylphosphoryl) spirofluorene, and
   the blue light emitting host present as the mixture comprises 1,3,5-triazine, 1,3,4-oxadiazolorphenyl phosphineoxide, and
   wherein the blue light emitting host comprises a phosphorescent material including carbazole, Firpic, UGH or CBP, or a fluorescent material including BAlq or LiPBO.

7. The organic light emitting display according to claim 5, further comprising an electron transport layer formed between the second electrode and the blue common light emitting layer,
   wherein the electron transport layer is doped with 0 to 10% of an n-type dopant including a compound containing an alkali metal, an alkaline earth metal, carbonate or a transition metal, or a compound containing an ion including —$BF_4$, —$PF_4$, —Li, —Na, —K, Rb or Cs.

8. The organic light emitting display according to claim 1, further comprising:
   a hole injection layer on the first electrode; and
   a hole transport layer formed between each of the red light emitting layer of the first sub-pixel, the green light emitting layer of the second sub-pixel and the blue common light emitting layer of the third sub-pixel, and the hole injection layer, such that hole transport layer contacts the blue common light emitting layer,
   wherein the blue common light emitting layer comprises a blue electron transport host, a blue hole transport host and a blue dopant, and
   the hole transport layer comprises the same blue host as the blue hole transport host.

9. The organic light emitting display according to claim 8, wherein the blue hole transport host comprises a single material or a mixture of a blue light emitting host and a hole transport host, The blue hole transport host present as the single material comprises N,N'-dicarbazolyl-3, 5-benzene or 4,4',4"-tris(N-carbazolyl) triphenylamine [TCTA], and The hole transport host present as the mixture comprises carbazole (dimer, monomer or oligomer), triphenylamine or aryl silane, and wherein the blue electron transport host comprises a single material, or a mixture of a blue light emitting host and an electron transport host, the blue electron transport host present as the single material comprises 1,3,5-tri(m-pyrid-3-yl-phenyl) benzene [TmPyPb] or 2-(diphenylphosphoryl) spirofluorene, and the blue light emitting host present as the mixture comprises 1,3,5-triazine, 1,3,4-oxadiazol, orphenyl phosphineoxide, and wherein the blue light emitting host comprises a phosphorescent material including carbazole, Firpic, UGH or CBP, or a fluorescent material including BAlq or LiPBO.

10. The organic light emitting display according to claim 8, wherein a doping content ratio of the blue electron transport host and the blue hole transport host in the blue common light emitting layer is 1:1 to 1:10 and the blue dopant has a concentration of 1% to 20% by weight, and wherein the hole transport layer has a triplet energy higher than a triplet energy of the blue hole transport host of the blue common light emitting layer.

11. A method for fabricating an organic light emitting display, the display comprising:

forming a first electrode on a substrate having first to third sub-pixels;

forming a red light emitting layer in the first sub-pixel by a solution process;

forming a green light emitting layer in the second sub-pixel by a solution process;

forming a blue common light emitting layer in the first to third sub-pixels by a deposition process; and forming a second electrode by a deposition process such that the second electrode faces the first electrode, wherein a thin film layer formed between the first electrode and the blue common light emitting layer and contacting the blue common light emitting layer comprises a blue host.

12. The method according to claim 11, further comprising:

forming a hole injection layer on the first electrode;

forming a hole transport layer on the hole injection layer; and forming a buffer layer by a solution process between each of the red light emitting layer of the first sub-pixel, the green light emitting layer of the second sub-pixel and the hole transport layer of the third sub-pixel, and the blue common light emitting layer such that buffer layer contacts the blue common light emitting layer, wherein the buffer layer comprises a blue light emitting host as the blue host and a buffer host.

13. The method according to claim 12, wherein the hole transport layer has a triplet energy higher than triplet energies of the red and green light emitting layers, and wherein a content of the blue light emitting host in the buffer layer is 10 to 15% by weight.

14. The method according to claim 12, wherein the blue common light emitting layer comprises a blue light emitting host, the blue light emitting host in the buffer layer is the same as or different from the blue light emitting host in the blue common light emitting layer and is formed using a phosphorescent material including carbazole, Firpic, UGH or CBP, or a fluorescent material including BAlq or LiPBO, the buffer host is a single host including a hole transport material or an electron transport material, or a mixed host including a mixture of the hole transport material and the electron transport material, and the mixed host comprises a buffer material including benzimidazole, phenanthroline, 1,3,4-oxadizole or 1,2,4-triazole and the single host comprises the hole transport material including carbazole (dimer, monomer or oligomer), triphenylamine or aryl silane, or the electron transport material including 1,3,5-triazine, 1,3,4-oxadiazolorphenyl phosphine oxide.

15. The method according to claim 11, further comprising forming a buffer layer by a solution process between each of the red light emitting layer of the first sub-pixel, the green light emitting layer of the second sub-pixel and the hole transport layer of the third sub-pixel, and the blue common light emitting layer such that the buffer layer contacts the blue common light emitting layer, wherein the buffer layer comprises a blue hole transport host as the blue host and a buffer host, and the blue common light emitting layer comprises a blue electron transport host and a blue dopant, and wherein a content of the blue electron transport host in the blue common light emitting layer is 2 to 20% by weight.

16. The method according to claim 15, wherein the blue hole transport host comprises a single material, or a mixture of a blue light emitting host and a hole transport host, and the blue hole transport host present as the single material comprises N,N'-dicarbazolyl-3,5-benzene or 4,4',4"-tris(N-carbazolyl) triphenylamine[TCTA] and the hole transport host present as the mixture comprises carbazole (dimer, monomer or oligomer), triphenylamine or aryl silane, and wherein the blue electron transport host comprises a single material, or a mixture of a blue light emitting host and an electron transport host, the blue electron transport host present as the single material comprises 1,3,5-tri(m-pyrid-3-yl-phenyl)benzene [TmPyPb] or 2-(diphenylphosphoryl)spirofluorene, and the blue light emitting host present as the mixture comprises 1,3,5-triazine, 1,3,4-oxadiazolorphenyl phosphine oxide, and wherein the blue light emitting host comprises a phosphorescent material including carbazole, Firpic, UGH or CBP, or a fluorescent material including BAlq or LiPBO.

17. The method according to claim 15, further comprising forming an electron transport layer between the second electrode and the blue common light emitting layer, wherein the electron transport layer is doped with 0 to 10% of an n-type dopant including a compound containing an alkali metal, an alkaline earth metal, carbonate or a transition metal, or a compound containing an ion including —$BF_4$, —$PF_4$, —Li, —Na, —K, Rb or Cs.

18. The method according to claim 11, further comprising:

forming a hole injection layer on the first electrode; and forming a hole transport layer by a solution process between each of the red light emitting layer of the first sub-pixel, the green light emitting layer of the second sub-pixel and the blue common light emitting layer of the third sub-pixel, and the hole injection layer such that the hole transport layer contacts the blue common light emitting layer, wherein the blue common light emitting layer comprises a blue electron transport host, a blue hole transport host and a blue dopant, and the hole transport layer comprises the same blue host as the blue hole transport host.

19. The method according to claim 18, wherein the blue hole transport host comprises a single material or a mixture of a blue light emitting host and a hole transport host, the blue hole transport host present as the single material comprises N,N'-dicarbazolyl-3,5-benzene or 4,4',4"-tris(N-carbazolyl)triphenylamine[TCTA], and the hole transport host present as the mixture comprises carbazole (dimer, monomer or oligomer), triphenylamine or aryl silane, and wherein the blue electron transport host comprises a single material, or a mixture of a blue light emitting host and an electron transport host, the blue electron transport host present as the single material comprises 1,3,5-tri(m-pyrid-3-yl-phenyl)benzene [TmPyPb] or 2-(diphenylphosphoryl)spirofluorene, and the blue light emitting host present as the mixture comprises 1,3,5-triazine, 1,3,4-oxadiazol, orphenyl phosphine oxide, and wherein the blue light emitting host comprises a phosphorescent material including carbazole, Firpic, UGH or CBP, or a fluorescent material including BAlq or LiPBO.

20. The method according to claim 18, wherein a doping content ratio of the blue electron transport host and the blue hole transport host in the blue common light emitting layer is 1:1 to 1:10 and the blue dopant has a concentration of 1% to 20% by weight, and wherein the hole transport layer has a triplet energy higher than a triplet energy of the blue hole transport host of the blue common light emitting layer.

* * * * *